(12) United States Patent
Okada

(10) Patent No.: US 6,566,729 B1
(45) Date of Patent: May 20, 2003

(54) SEMICONDUCTOR DEVICE INCLUDING LASER-BLOWN LINKS

(75) Inventor: Hiroshi Okada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/706,790

(22) Filed: Nov. 7, 2000

(30) Foreign Application Priority Data

Feb. 16, 2000 (JP) ........................................ 2000-037391

(51) Int. Cl.[7] .............................................. H01L 29/00
(52) U.S. Cl. ........................ 257/529; 257/530; 257/209
(58) Field of Search ................................ 257/226, 209, 257/529, 530, 283; 438/132, 467, 281, 601

(56) References Cited

U.S. PATENT DOCUMENTS

| 5,608,257 A | * | 3/1997 | Lee et al. .................... 257/529 |
| 6,177,714 B1 | * | 1/2001 | Nagai .......................... 257/529 |

* cited by examiner

*Primary Examiner*—Phat X. Cao
*Assistant Examiner*—Theresa T. Doan
(74) *Attorney, Agent, or Firm*—Volentine Francos, PLLC

(57) ABSTRACT

In a semiconductor device having fusible conductive links, dummy patterns are formed in the vicinity of the fusible conductive links. As a density of a fuse region becomes thick by the dummy patterns, the fusible conductive links can be precisely formed.

2 Claims, 4 Drawing Sheets

SEMICONDUCTOR DEVICE INCLUDING LASER-BLOWN LINKS

The present application claims priority under 35 U.S.C. §119 to Japanese Application No. 2000-037391 filed on Feb. 16, 2000, which is hereby incorporated by reference in its entirely for all purposes.

BACKGROUND OF THE INVENTION

1. Field of the Invention

The present invention relates to a semiconductor device which includes laser-blown links.

2. Description of the Related Art

Fusible conductive links are commonly used in solid state device production, including, for example, integrated circuit (IC) production. One type of fusible link is normally conductive, and is rendered non-conductive by one or more pulses of laser energy or electric current directed to the link. The energy melts the conductive link material, thereby removing it from the conductive path. The conductive material may be a metal, for example aluminum, or alternately may be doped polysilicon or a metal silicide. The links are typically formed on a top dielectric layer in a step of forming the top conductive layer using a RIE (reactive ion etching) process. Etching gasses in the RIE process are easy to spread toward a densely patterned region in which various conductive patterns are formed. The fusible links are normally formed in a fuse region away from the densely patterned region.

Therefore, as the etching gasses are mainly used for forming the various conductive patterns in the densely patterned region, the gasses for forming the fusible links are reduced. That is, a part of the gasses are intercepted by forming the many conductive patterns in the densely patterned region. Thereby, a width of the fusible links becomes wider, as comparing with a predetermined size.

In such case, it is difficult to melt the fusible links by a predetermined laser energy. That is, a time for melting the links becomes longer than a predetermined melting time. Consequently, a cost and a processing time for forming the semiconductor device are increased.

SUMMARY OF THE INVENTION

An object of the present invention is to provide a semiconductor device including laser-blown links which allow to form the links precisely.

To achieve the object, in a semiconductor device having fusible conductive links, wherein a dummy pattern is formed in the vicinity of the fusible conductive link.

According to the present invention, as a density of a fuse region becomes high, comparing with the conventional art, a semiconductor device can be realized which includes fusible conductive links which are precisely formed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In these embodiments, one fusible conductive link is typically described hereinafter in order to easily understand. Descriptions of these embodiments are illustrated with a two-level interconnect scheme, but the use of the embodiments with any number of conductor levels is possible.

Figure 1:
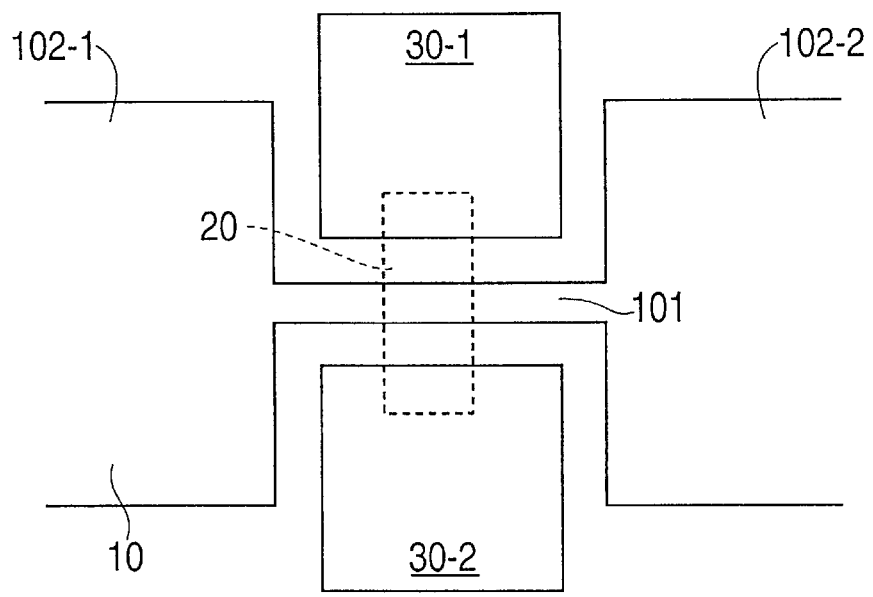
FIG. 1 is a plane view describing a semiconductor device according to a first preferred embodiment.

FIG. 1 is a plane view describing a fuse in a semiconductor device according to a first preferred embodiment.

A conductive fuse 10 is comprised of a first terminal 102-1, a second terminal 102-2 and a fusible conductive link 101 which links the first terminal 102-1 with the second terminal 102-2, as shown in FIG. 1. The conductive fuse 10 is formed on a dielectric layer (not shown in FIG. 1), such as a silicon dioxide layer.

A first dummy pattern 30-1 and a second dummy pattern 30-2 are formed in the vicinity of the fusible conductive link 101. Similar to the conductive fuse 10, the first and second dummy patterns 30-1, 30-2 are formed on the dielectric layer.

The fusible link 101 is intermediate between the first dummy pattern 30-1 and the second dummy pattern 30-2. The first and second dummy patterns 30-1, 30-2 are not connected with the fusible link 101.

A conductive line 20 which is formed under the dielectric layer, is perpendicular to the fusible link 101. In this embodiment, the conductive line 20 does not connect with any conductive patterns.

The fusible link 101 is conductive and is rendered non-conductive by one or more pulses of laser energy or electric current directed to the link. The energy melts the fusible link 101, thereby removing it from the conductive path between the first terminal 102-1 and the second terminal 102-2. The fusible link 101 may be a metal, for example aluminum, or alternately may be doped polysilicon or a metal silicide.

The first and second terminals 102-1, 102-2, the link 110 and the first and second dummy patterns 30-1, 30-2 are typically formed on the top dielectric layer in a step of forming a top conductive layer using a RIE (reactive ion etching) method. That is, in this embodiment, the first and second terminals 102-1, 102-2, the fusible conductive link 101 and the first and second dummy patterns 30-1, 30-2 are simultaneously formed in the same process which forms the top conductive layer using the RIE method.

Figure 2:
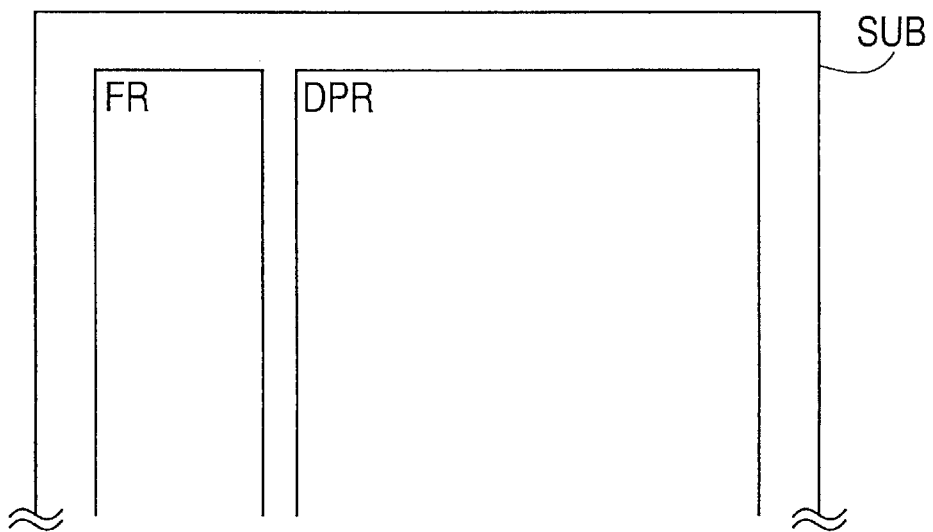
FIG. 2 is a plane view describing the semiconductor device in FIG. 1.

As shown in FIG. 2, the fuse 10 and the dummy patterns 30-1, 30-2 are formed in a fuse region FR away from a densely patterned region DPR in which various conductive patterns (not shown) are formed. Naturally, the fuse region FR and the densely patterned region DPR are any parts over a semiconductor substrate SUB.

Intervals between the fusible link 101 and the dummy patterns 30-1, 30-2 are set in predetermined distances so as to avoid contacting between the fusible link 101 and the dummy patterns 30-1, 30-2 after melting the link 101 by the laser.

According to the first preferred embodiment, etching gasses in the RIE process for forming the fuse and the top conductive layer are easy to spread toward the fuse region in addition to the densely patterned region. That is, as the dummy patterns are formed in the vicinity of the fusible link, a density of patterns raises in the fuse region, similar to the densely patterned region. Consequently, the etching gasses can be supplied for the fuse region.

As a result, a width of the fusible link can be formed with a predetermined size. So, it is possible to melt the fusible link by a predetermined laser energy. That is, a time for melting the link becomes can be shortened, as comparing with the conventional fuse. Consequently, a cost and a processing time for forming the semiconductor device are reduced.

Figure 3:
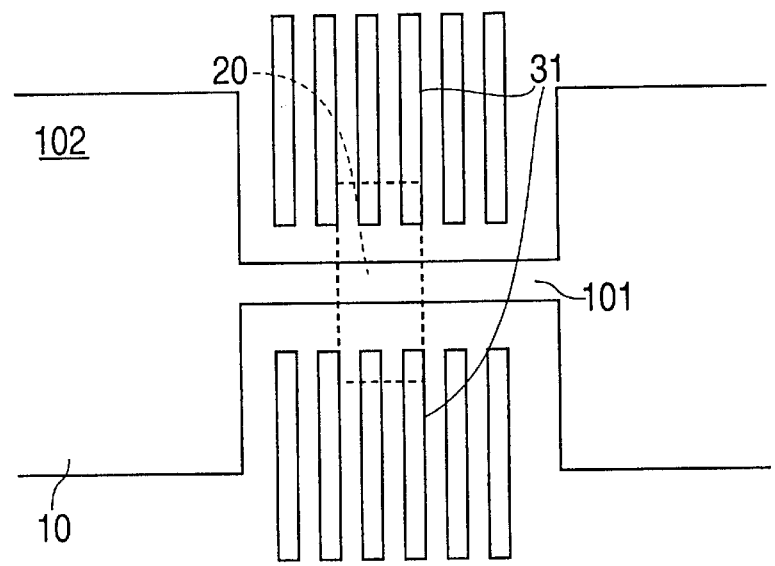
FIG. 3 is a plane view describing a semiconductor device according to a second preferred embodiment.

FIG. 3 is a plane view describing a fuse in a semiconductor device according to a second preferred embodiment. The same elements mentioned above are marked at the same symbols and a description thereof is omitted.

As shown in FIG. 3, a plurality of elongate patterns 31 are arranged in the vicinity of the fusible link 101 instead of the first and second dummy patterns 30-1, 30-2. The elongate patterns 31 are perpendicular to the fusible link 101.

Similar to the first embodiment, the elongate patterns 31 is formed in the same step for forming the fuse 10 and the top conductive patterns.

According to the second preferred embodiment, as the elongate patterns are difficult to contact with the fusible link, intervals between the elongate patterns and the link can be reduced in addition to the effect of the first preferred embodiment. Thereby, a width of the fusible link can be reduced, as comparing with the first preferred embodiment.

Figure 4:
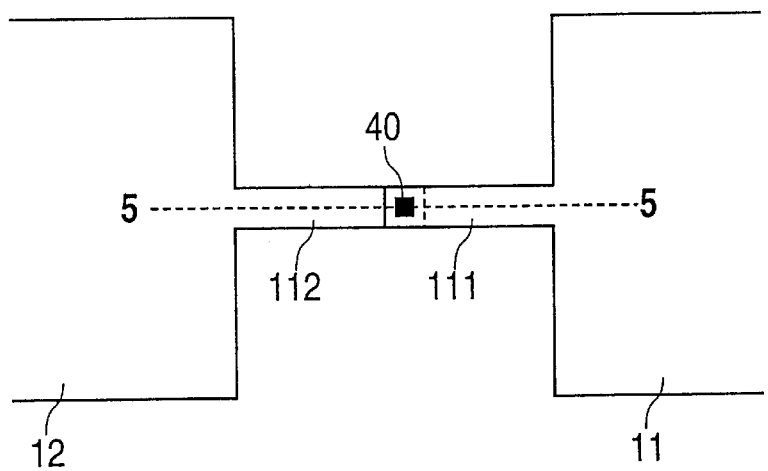
FIG. 4 is a plane view describing a semiconductor device according to a third preferred embodiment.
Figure 5:
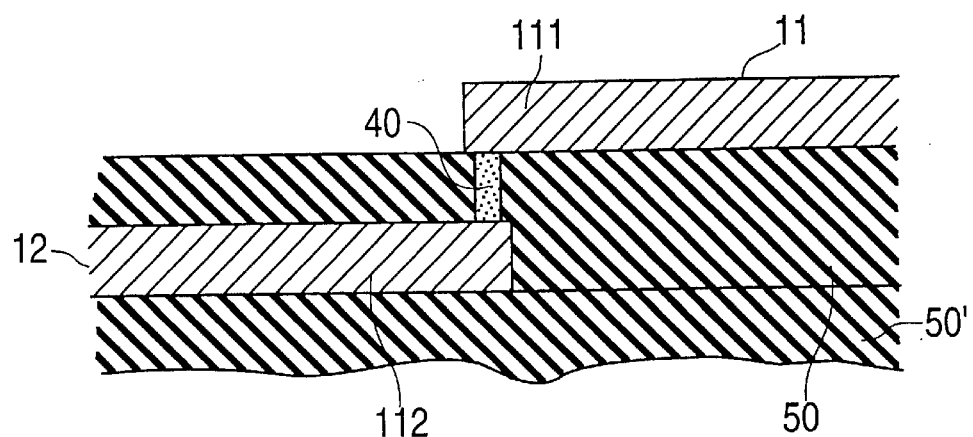
FIG. 5 is a cross section at a portion along line X–X' shown in FIG. 4.

"FIG. 4 is a plane view describing a fuse in a semiconductor device according to a third preferred embodiment. FIG. 5 is a cross section at a portion along line 5—5 shown in FIG. 4."

"A fuse of this embodiment comprises a first terminal 11, a first fusible link 111, a second terminal 12 and a second fusible link 112. The first terminal 11 and the first fusible link 111 which is connected to the first terminal are formed on a dielectric layer 50, such as silicon dioxide. Similar to the embodiment mentioned above, the first terminal 11 and the first fusible link 111 are formed in the same step for forming the top conductive patterns."

"The second terminal 12 and the second fusible link 112 which is connected to the second terminal 112 are formed under the dielectric layer 50 using a well-known process. The second terminal 12 and the second fusible link 112 are formed on an under layer 50'. The under layer 50' is an insulating layer or a semiconductor substrate."

Similary, the first and second terminal 11, 12 and the links 111, 112 may be a metal, for example aluminum, or alternately may be doped polysilicon or a metal silicide.

The fusible link 111 is connected to the second fusible link 112 in series through a conductive material which is filled into a contact hole 40 formed in the dielectric layer 50. In this embodiment, the conductive material is the same material of the terminals 11, 12 and the links 111, 112. Naturally, other conductive materials can be used as the conductive material.

A resistance in the contact hole 40 is much higher than resistances of the if fusible links 111, 112. Therefore, in the case where current is passed between the first terminal 11 and the second terminal 12, a heat concentration is occurred in the contact hole 40. Thereby, it is easy to melt the connection between the first link 111 and the second link 112.

According to the third embodiment, the contact hole which has a high resistance enables to remove the conductive path between the first terminal and the second terminal in the fuse easily.

Figure 6:
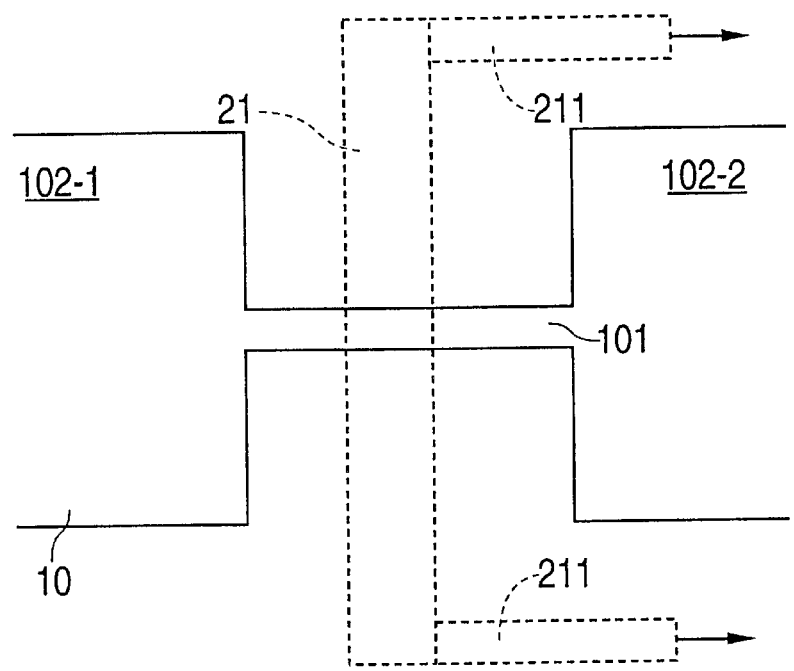
FIG. 6 is a plane view describing a semiconductor device according to a fourth preferred embodiment.

FIG. 6 is a plane view describing a fuse in a semiconductor device according to a fourth preferred embodiment. The same elements mentioned above are marked at the same symbols and a description thereof is omitted.

In this embodiment, a conductive line 21 which is formed under the dielectric layer, is perpendicular to the fusible link 101. The conductive line 21 is formed in the same step forming a conductive pattern in an under layer.

The conductive line 21 is connected to a power supply which supplies a power supply voltage through conductive patterns 211.

When the conductive path (the fusible link 101) between the first terminal 102-1 and the second terminal 102-2 is removed, current is passed between the first terminal 102-1 and the second terminal 102-2 and current is simultaneously passed through the conductive line 21. The current of the conductive line 21 is supplied from the power supply voltage through the conductive patterns 211.

According to the fourth preferred embodiment, as a temperature in the vicinity between the conductive line 21 and the fusible link 101 is raised by the current, it enables to remove the conductive path between the first terminal and the second terminal in the fuse easily.

Figure 7:
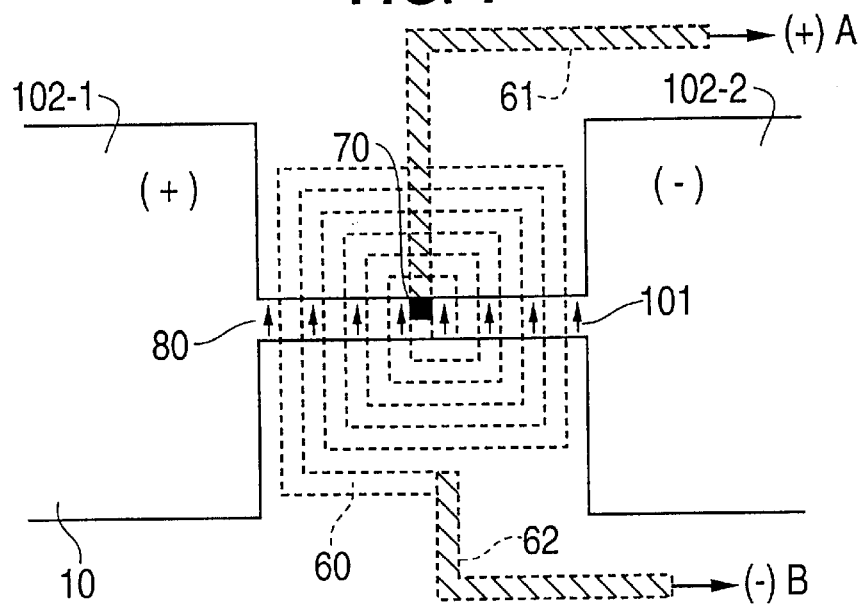
FIG. 7 is a plane view describing a semiconductor device according to a fifth preferred embodiment.

FIG. 7 is a plane view describing a fuse in a semiconductor device according to a fifth preferred embodiment. The same elements mentioned above are marked at the same symbols and a description thereof is omitted.

In this embodiment, a conductive line 60 which is formed under the dielectric layer, is arranged in a spiral. Portions of the conductive line 60 are perpendicular to the fusible link 101, as shown in FIG. 7. The conductive line 60 is formed in the same step forming a conductive pattern in an under layer.

The conductive line 60 is connected to a plus electrode (+) A through a first conductive pattern 61 and is connected to a minus electrode (−) B through a second conductive pattern 62. The conductive line 60 is connected to the fusible link 101 through a conductive material which is filled into a contact hole 70. In this embodiment, the conductive material is the same material of the terminals 11, 12 and the links 111, 112. Naturally, other conductive materials can be used as the conductive material.

When the conductive path (the fusible link 101) between the first terminal 102-1 and the second terminal 102-2 is removed, a plus voltage (+) is provided to the first terminal 102-1 and a minus voltage (−) is provided to the second terminal 102-2, a plus voltage (+) is provided to the plus electrode (+)A and a minus voltage (−) is provided to the minus electrode (−). Thereby, current is passed between the first terminal 102-1 and the second terminal 102-2 and current is simultaneously passed through the conductive line 60 between the plus electrode (+) A and the minus electrode (−) B.

As a magnetic field is occurred on the spiral conductive line 60 by the current passing in the spiral conductive line 60, a Lorentz power 80 shown in FIG. 7 as the arrows, effects on electrons in the fusible link 101. So, a current concentration which is caused by the Lorentz power 80, enables to remove the conductive path between the first terminal and the second terminal in the fuse easily.

The first conductive pattern 61, the second conductive pattern 62 and the spiral conductive line 60 are formed by steps described hereinafter.

First, the first conductive pattern 61 which is connected to the plus electrode (+)A, is formed over a semiconductor wafer (not shown). An insulating layer (not shown) is formed on the first conductive pattern 61. The spiral conductive pattern 60 and the second conductive pattern 62 which is connected to the minus electrode (−)B are formed on the insulating layer. A contact hole 70 which connects the first conductive pattern 61 with the spiral conductive pattern 60 is formed in the insulating layer. A conductive material is filled into the contact hole 70. A second insulating layer is formed on the spiral conductive pattern 60 and the second conductive pattern 62. The fuse 10 is formed on the second insulating layer in the same step for forming the top conductive patterns.

According to the fifth preferred embodiment, a current concentration which is caused by the Lorentz power 80 enables to remove the conductive path between the first terminal and the second terminal in the fuse easily.

Figure 8:
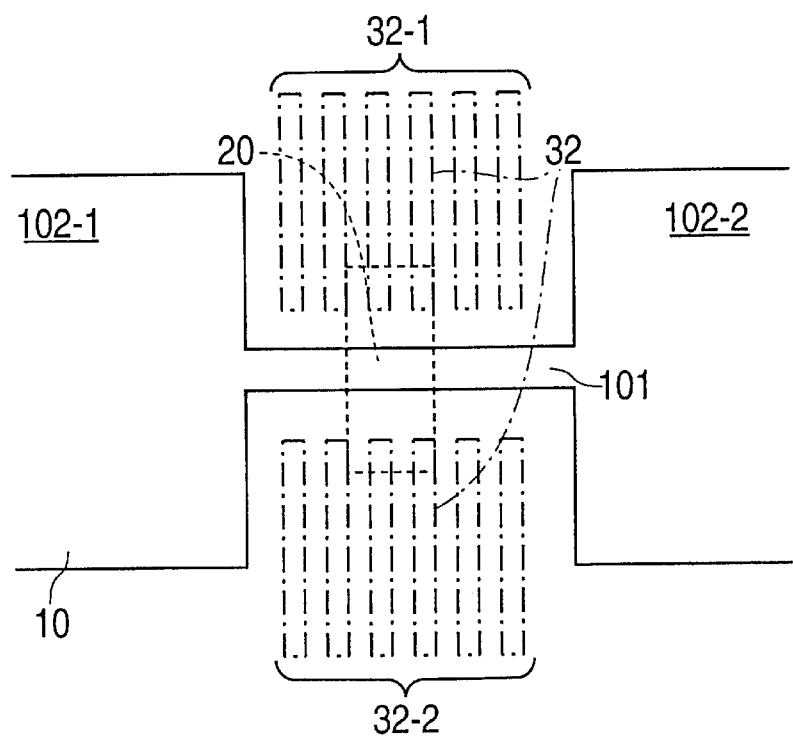
FIG. 8 is a plane view describing a semiconductor device according to a sixth preferred embodiment.

FIG. 8 is a plane view describing a fuse in a semiconductor device according to a sixth preferred embodiment. The same elements mentioned above are marked at the same symbols and a description thereof is omitted.

"In this embodiment, a plurality of elongate patterns 32 are arranged on a mask. That is, the elongate patterns 32 are not formed over a semiconductor wafer. Each elongate pattern 32 on the mask has a narrow width which is smaller than a resolution limit in a photo-lithography technique."

As the width of the elongate pattern 32 is smaller than the resolution limit, the elongate pattern 32 are not transferred to the semiconductor wafer. Such technique is well-known as a OPC (Optical Proximity Collection) technique. A fuse 10 including a first and a second conductive terminals 102-1, 102-2 and a fusible link 101 and the elongate patterns 32 are formed on the mask. The elongate patterns 32 are arranged in the vicinity of the fusible link 101. The elongate patterns 32 are perpendicular to the fusible link 101 and are not connected with each other. The fusible link 101 is intermediate between a first group 32-1 of the elongate patterns and a second group 32-2 of the elongate patterns, as shown in FIG. 8. The first and second dummy patterns 30-1, 30-2 are not connected with the fusible link 101. These patterns on the mask are formed by an electron beam.

Such patterns on the mask are transferred to the semiconductor wafer in the photo-lithography technique. Thereby, it is possible to obtain a similar effect of the first preferred embodiment without forming the dummy patterns (the elongate patterns 32) on the semiconductor wafer.

According to the sixth preferred embodiment, as actual dummy patterns are not formed on the semiconductor wafer, intervals between the dummy patterns and the fusible link can be reduced to a minimum size. Thereby, a width of the fusible link can be reduced, as comparing with the second preferred embodiment.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semiconductor device comprising:

a semiconductor substrate;

an insulating layer which is formed over the semiconductor substrate;

a fusible conductive link which is located on the insulating layer, wherein the fusible conductive link is comprised of a first conductive material; and a first dummy pattern which is located on the insulating layer and in a vicinity of the fusible conductive link, wherein the first dummy pattern is comprised of the first conductive material, wherein an interval between the fusible conductive link and the first dummy pattern is set to a predetermined distance so as to avoid contact between the fusible conductive link and the first dummy pattern after melting of the fusible conductive link by a laser, wherein the first dummy pattern is comprised of a plurality of elongate patterns, wherein the elongate patterns are lengthwise perpendicular to the fusible conductive link.

2. The semiconductor device according to claim 1, further comprising a second dummy pattern comprised of a plurality of elongate patterns, wherein the elongate patterns of the second dummy pattern are lengthwise perpendicular to the fusible conductive link.

* * * * *